(12) United States Patent
Ibara et al.

(10) Patent No.: US 9,502,589 B2
(45) Date of Patent: Nov. 22, 2016

(54) SOLAR CELL, SOLAR CELL MODULE, AND METHOD FOR MANUFACTURING SOLAR CELL

(71) Applicant: SANYO Electric Co., Ltd., Osaka (JP)

(72) Inventors: Yoshikazu Ibara, Gifu (JP); Toyozou Nishida, Hyogo (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 325 days.

(21) Appl. No.: 14/193,638

(22) Filed: Feb. 28, 2014

(65) Prior Publication Data

US 2014/0174531 A1    Jun. 26, 2014

Related U.S. Application Data

(63) Continuation of application No. PCT/JP2011/072325, filed on Sep. 29, 2011.

(51) Int. Cl.
  *H01L 31/00* (2006.01)
  *H01L 31/0224* (2006.01)
  *H01L 31/048* (2014.01)
  *H01L 31/0747* (2012.01)

(52) U.S. Cl.
  CPC ..... *H01L 31/022425* (2013.01); *H01L 31/048* (2013.01); *H01L 31/0747* (2013.01); *Y02E 10/50* (2013.01)

(58) Field of Classification Search
  CPC .............. H01L 31/022425; H01L 31/022433; H01L 31/048; H01L 31/0481
  See application file for complete search history.

(56) References Cited

U.S. PATENT DOCUMENTS

| | | | |
|---|---|---|---|
| 5,344,498 A * | 9/1994 | Inoue | H01L 31/02167 136/251 |
| 5,543,333 A * | 8/1996 | Holdermann | H01L 31/022425 136/256 |
| 6,429,037 B1 | 8/2002 | Wenham et al. | |
| 2004/0233537 A1* | 11/2004 | Agrawal | B60R 1/088 359/604 |
| 2007/0240759 A1* | 10/2007 | Borden | H01L 31/0322 136/258 |
| 2008/0121266 A1* | 5/2008 | Tsunomura | H01L 31/0747 136/244 |
| 2009/0223549 A1 | 9/2009 | Ounadjela et al. | |
| 2009/0239331 A1 | 9/2009 | Xu et al. | |
| 2011/0100459 A1 | 5/2011 | Yoon et al. | |
| 2011/0139243 A1 | 6/2011 | Shim et al. | |

FOREIGN PATENT DOCUMENTS

| | | |
|---|---|---|
| JP | 03250671 A | 11/1991 |
| JP | 2000058885 A | 2/2000 |
| JP | 2004247596 A | 9/2004 |
| JP | 2011171270 A | 9/2004 |
| JP | 2009231840 A | 10/2009 |
| JP | 2011514011 A | 4/2011 |

OTHER PUBLICATIONS

Japanese Office Action corresponding to Application No. 2013-535734; Date of Mailing: Jan. 6, 2015.
Extended European Search Report corresponding to Application No. 11873077.9-1504/2763185, PCT/JP2011072325; Date of Mailing: Mar. 27, 2015.
Japanese Notice of Grounds for Rejection for JP2013-535734; issued Jul. 14, 2015.

* cited by examiner

*Primary Examiner* — Eli Mekhlin
(74) *Attorney, Agent, or Firm* — Cantor Colburn LLP

(57) ABSTRACT

A solar cell has a collecting electrode formed therein. The collecting electrode is provided with: a main conductive layer that contains copper; and an overcoat layer that covers at least a part of the main conductive layer.

6 Claims, 4 Drawing Sheets

SOLAR CELL, SOLAR CELL MODULE, AND METHOD FOR MANUFACTURING SOLAR CELL

CROSS-REFERENCE TO RELATED APPLICATIONS

The present application is a continuation under 35 U.S.C. §120 of PCT/JP2011/072325, filed Sep. 29, 2011, which is incorporated herein by reference.

TECHNICAL FIELD

The present invention relates to a solar cell, a solar cell module, and a manufacturing method of a solar cell.

BACKGROUND ART

In recent years, solar cells which can convert solar light into electrical energy have been used as an alternative energy source for petroleum. Solar cells include a monocrystalline solar cell, a polycrystalline solar cell, an amorphous solar cell, or a combination of these solar cells.

In a solar cell, in order to extract the generated electric power to the outside, a collecting electrode such as a finger portion and a bus bar portion is provided on a front surface and a back surface of the solar cell. In recent years, in consideration of the high conductivity, ease of machining, and price of material, a collecting electrode formed by plating is often employed, as described in Patent Document 1. When the collecting electrode is formed by plating, in the related art, materials such as nickel (Ni), copper (Cu), chrome (Cr), zinc (Zn), tin (Sn), and silver (Ag) are used. In particular, in relation to the cost and resistivity, copper is preferably used.

RELATED ART REFERENCES

Patent Document

[Patent Document 1] JP 2000-58885 A

DISCLOSURE OF INVENTION

Technical Problem

A solar cell is in many cases used in a form of a solar cell module in which the solar cell is sealed in a sealing layer between a encapsulating member on a side of a light receiving surface and a encapsulating member on a side of a back surface. For solar cell modules normally used outdoors, in addition to the output characteristic, reliability is also required.

Solution to Problem

According to one aspect of the present invention, there is provided a solar cell in which a collecting electrode is formed on at least one of a light receiving surface and a back surface, wherein the collecting electrode comprises a primary conductive layer including copper, and at least one of an overcoat layer covering an upper surface side of the primary conductive layer and an undercoat layer covering a lower surface side of the primary conductive layer.

According to another aspect of the present invention, there is provided a method of manufacturing a solar cell, comprising: a first step of forming a coating layer having an opening over at least one of a light receiving surface and a back surface; a second step of plating the one surface which is exposed in the opening with a metal, to thereby form a collecting electrode having a lower thickness than that of the coating layer; and a third step of covering the coating layer and the collecting electrode with a sealing layer, wherein the second step comprises a step of forming a primary conductive layer including copper, and a step of forming at least one of an overcoat layer covering an upper surface side of the primary conductive layer and an undercoat layer covering a lower surface side of the primary conductive layer.

Advantageous Effects of Invention

According to various aspects of the present invention, reliability of a solar cell module can be improved.

BEST MODE FOR CARRYING OUT THE INVENTION

First Preferred Embodiment

Figure 1:
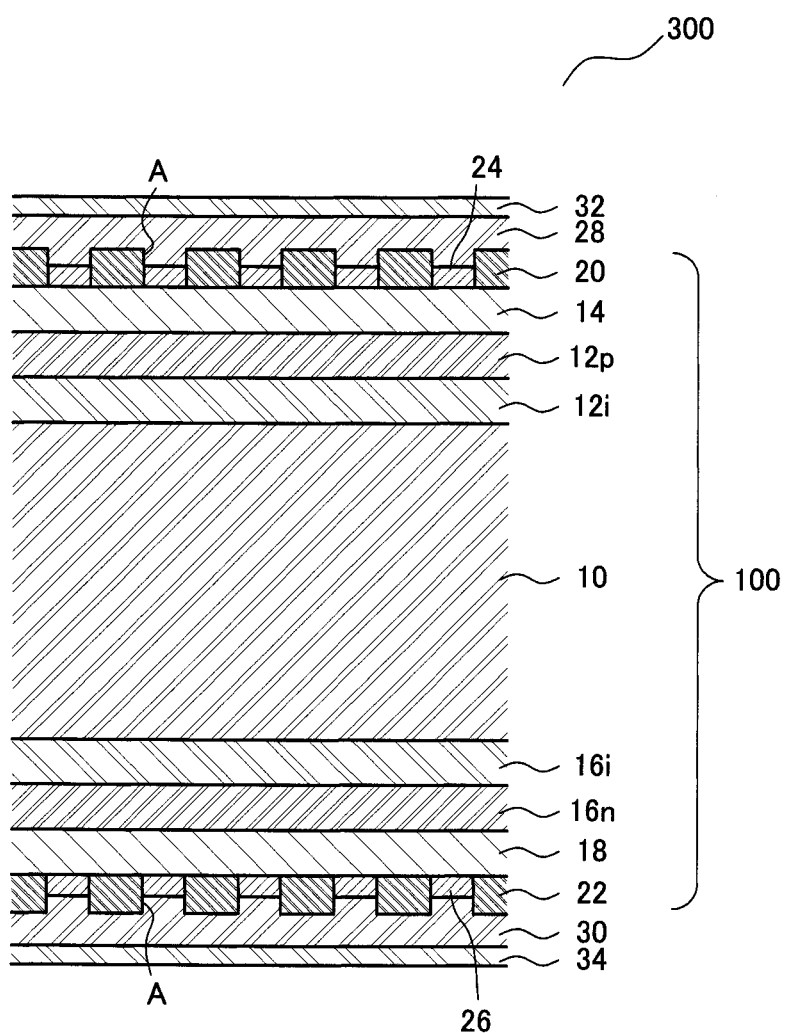
FIG. 1 is a cross sectional diagram showing a structure of a solar cell module according to a first preferred embodiment of the present invention.

As shown in a cross sectional diagram of FIG. 1, a solar cell 100 according to a first preferred embodiment of the present invention comprises a substrate 10, an i-type amorphous layer 12$i$, a p-type amorphous layer 12$p$, a transparent conductive layer 14, an i-type amorphous layer 16$i$, an n-type amorphous layer 16$n$, a transparent conductive layer 18, coating layers 20 and 22, and collecting electrodes 24 and 26. The i-type amorphous layer 12$i$, the p-type amorphous layer 12$p$, the i-type amorphous layer 16$i$, and the n-type amorphous layer 16$n$ may include crystal grains. In addition, a solar cell module 300 comprises the solar cell 100, sealing layers 28 and 30, and encapsulating members 32 and 34.

A structure of the solar cell 100 will now be described while a manufacturing method of the solar cell 100 is described.

The substrate 10 is a wafer-shaped plate made of a crystalline semiconductor material. The substrate 10 may be a substrate made of a crystalline semiconductor of an n-type conductivity or a p-type conductivity. For the substrate 10, for example, a monocrystalline silicon substrate, a polycrystalline silicon substrate, a gallium arsenide substrate (GaAs), an indium phosphide substrate (InP), or the like may be employed. The substrate 10 absorbs incident light and produces carrier pairs of electrons and holes by a photoelectric conversion effect. In the following, an example configuration will be described which uses a substrate made of n-type monocrystalline silicon as the substrate 10.

First, a pre-process such as cleaning is applied on the substrate 10. In the pre-process, a projection-and-depression structure which is called a textured structure is formed on at least the light receiving surface of the substrate 10.

The i-type amorphous layer 12$i$ is, for example, an intrinsic amorphous silicon semiconductor layer formed over one primary surface of the substrate 10. The i-type amorphous layer 12$i$ may contain hydrogen. The p-type amorphous layer 12$p$ is formed over the i-type amorphous layer 12$i$. The p-type amorphous layer 12$p$ is, for example, a p-type amorphous silicon semiconductor layer. The p-type amorphous layer 12$p$ may contain hydrogen.

The i-type amorphous layer 12$i$ is inserted between the p-type amorphous layer 12$p$ and the substrate 10 in order to improve a contact characteristic between the p-type amorphous layer 12$p$ and the substrate 10. Because of this, a thickness of the i-type amorphous layer 12$i$ is set to a thickness which would substantially not contribute to power generation, for example, in a range of greater than or equal to 0.1 nm and less than or equal to 25 nm, and more preferably, in a range of greater than or equal to 5 nm and less than or equal to 10 nm.

The i-type amorphous layer 12$i$ and the p-type amorphous layer 12$p$ may be formed through film formation methods such as CVD, such as plasma chemical vapor deposition or sputtering.

The i-type amorphous layer 16$i$ is, for example, an intrinsic amorphous silicon semiconductor layer formed over the other primary surface of the substrate 10. The i-type amorphous layer 16$i$ may contain hydrogen. The n-type amorphous layer 16$n$ is formed over the i-type amorphous layer 16$i$. For example, the n-type amorphous layer 16$n$ is an n-type amorphous silicon semiconductor layer. The n-type amorphous layer 16$n$ may contain hydrogen.

The i-type amorphous layer 16$i$ is inserted between the n-type amorphous layer 16$n$ and the substrate 10 in order to improve a contact characteristic between the n-type amorphous layer 16$n$ and the substrate 10. Because of this, similar to the i-type amorphous layer 12$i$, a thickness of the i-type amorphous layer 16$i$ is set to a thickness which would substantially not contribute to the power generation, for example, in a range of greater than or equal to 0.1 nm and less than or equal to 25 nm, more preferably, in a range of greater than or equal to 5 nm and less than or equal to 10 nm.

The i-type amorphous layer 16$i$ and the n-type amorphous layer 16$n$ can be formed through film formation methods such as CVD, sputtering, or the like.

The transparent conductive layer 14 is formed over the p-type amorphous layer 12$p$, and the transparent conductive layer 18 is formed over the n-type amorphous layer 16$n$. The transparent conductive layers 14 and 18 are formed including, for example, at least one of metal oxides such as indium oxide, zinc oxide, tin oxide, and titanium oxide, and these metal oxides may be doped with a dopant such as tin, zinc, tungsten, antimony, titanium, cerium, and gallium. The transparent conductive layers 14 and 18 may be formed though film formation methods such as evaporation, CVD, and sputtering. Thicknesses of the transparent conductive layers 14 and 18 can be suitably adjusted by indices of refraction of the transparent conductive layers 14 and 18, or the like.

The coating layer 20 is formed over the transparent conductive layer 14, and the coating layer 22 is formed over the transparent conductive layer 18. The coating layers 20 and 22 are preferably insulating because the collecting electrodes 24 and 26 will be formed through electroplating as will be described later, but the structure of the coating layers 20 and 22 is not limited to such a structure. The coating layers 20 and 22 are preferably made of a photo-curing resin in consideration of the machinability. For example, the coating layers 20 and 22 are made of an epoxy-based, an acrylate-based, or an olefin-based ultraviolet curing resin.

Figure 2:
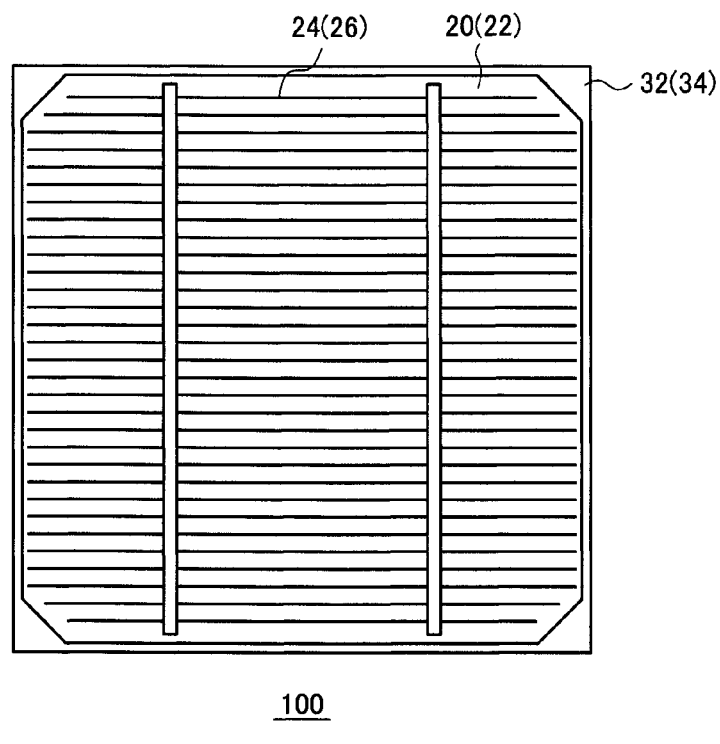
FIG. 2 is a plan view showing a structure of the solar cell module according to the first preferred embodiment of the present invention.

The coating layers 20 and 22 can be formed over the transparent conductive layers 14 and 18 through spin-coating, spraying, or printing. Thicknesses of the coating layers 20 and 22 can be adjusted, when the coating layers 20 and 22 are formed using resin materials, by the viscosity of the resin material or the formation conditions. For example, when spin-coating is employed, the thickness can be adjusted by the conditions such as the rotational speed and number of rotations of the spin-coat. As shown in a plan view of FIG. 2, the coating layers 20 and 22 are formed in a pattern having an opening A (refer to FIG. 1) corresponding to the shapes of the collecting electrodes 24 and 26 to be described later. With the use of the photo-curing resin for the coating layers 20 and 22, the coating layers 20 and 22 can be patterned by applying a photolithography technique. The opening A is formed such that a part of the transparent conductive layers 14 and 18, which are layers below the coating layers 20 and 22, is exposed.

The collecting electrode 24 is a conductive layer over the transparent conductive layer 14, and the collecting electrode 26 is a conductive layer over the transparent conductive layer 18. The collecting layers 24 and 26 preferably have an comb-shaped structure including a plurality of finger portions and a bus bar portion connecting the plurality of finger portions, so that the electric power generated by the solar cell 100 can be evenly collected.

The collecting electrode will now be descried exemplifying the collecting electrode 24. As shown in an enlarged cross sectional diagram of FIG. 3, the collecting electrode 24 has a multilayer structure including a primary conductive layer 24$a$ and an overcoat layer 24$b$. The primary conductive layer 24$a$ is a metal layer having a primary composition of copper, in consideration of the high conductivity, the ease of machining, and the price of the material. The overcoat layer 24$b$ is an overcoating layer of the primary conductive layer 24$a$, and is placed between the primary conductive layer 24$a$ and the sealing layer 28 to be described later. The overcoat layer 24$b$ is a metal layer including at least one of nickel (Ni), tin (Sn), titanium (Ti), tantalum (Ta), tungsten (W), and palladium (Pd). It is sufficient that the overcoat layer 24$b$ cover at least a part of the primary conductive layer 24$a$ so that the primary conductive layer 24$a$ does not directly contact the sealing layer 28, but the overcoat layer 24$b$ preferably covers the entire primary conductive layer 24$a$.

A thickness of the primary conductive layer 24$a$ may be determined according to a width of the collecting electrode 24 and necessary conductivity, and is preferably set, for example, to about a few tens of μm. A thickness of the overcoat layer 24$b$ is preferably set in a range of greater than or equal to 0.2 μm and less than or equal to 10 μm according to a diffusion characteristic of copper among the materials forming the overcoat layer 24$b$. For example, because nickel has a smaller diffusion coefficient with respect to copper, when the overcoat layer 24b is formed using nickel, the thickness may be set to be greater than or equal to 0.2 µm, and when the overcoat layer 24b is formed with tin, the thickness is preferably set to be greater than or equal to 5 µm.

Figure 3:
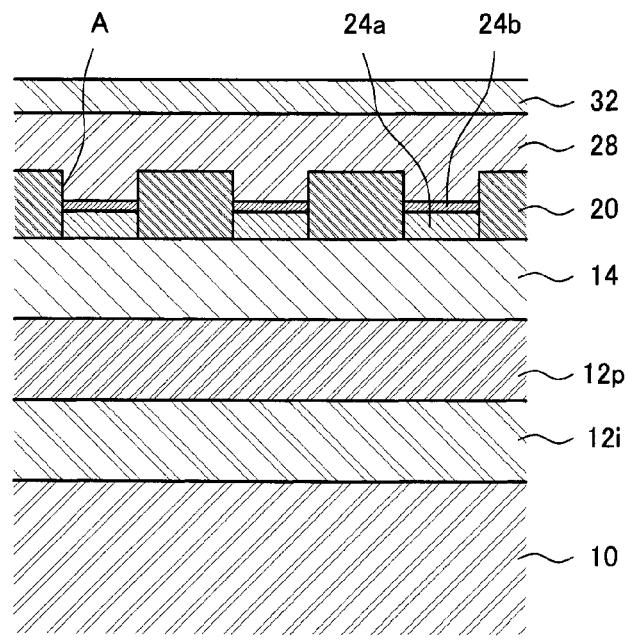
FIG. 3 is an enlarged cross sectional diagram showing a structure of the solar cell module according to the first preferred embodiment of the present invention.
Figure 4:
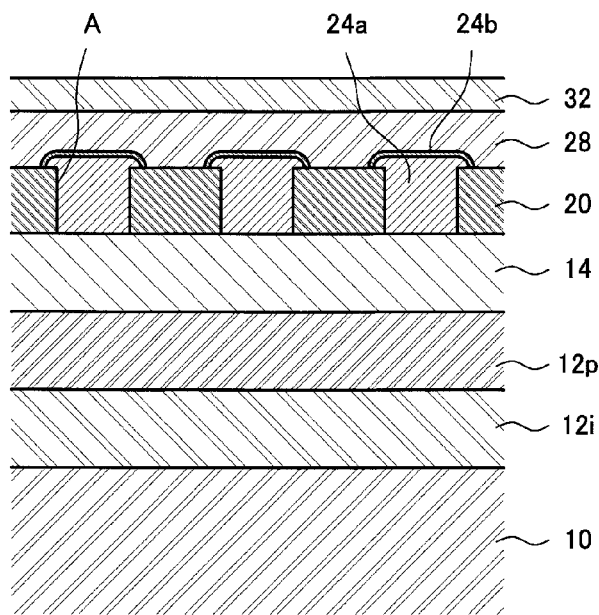
FIG. 4 is an enlarged cross sectional diagram showing another configuration of the structure of the solar cell module according to the first preferred embodiment of the present invention.

The collecting electrode 24 is embedded in the opening A of the coating layer 20. A thickness of the collecting electrode 24 may be set thinner than the thickness of the coating layer 20 as shown in FIG. 3, or may be set thicker than the thickness of the coating layer 20 as shown in FIG. 4. By setting the thickness of the collecting electrode 24 to be thinner than the thickness of the coating layer 20, a depression formed by an upper surface of the collecting electrode 24 and side surfaces of the coating layer 20 is formed in the opening A. The sealing layer 28 then enters the depression of the opening A. Because of this, even when the sealing layer 28 is thermally expanded during the use, the thermal expansion of the sealing layer 28 is inhibited by the side surfaces of the opening A of the coating layer 20. As a result, a close-contact property of the coating layer 20 and the sealing layer 28 can be improved, and the detachment of the coating layer 20 and the sealing layer 28 can be inhibited.

In addition, a contact area between the collecting electrode 24 and the sealing layer 28 is reduced, and thus the reliability of the solar cell module 300 can be improved as will be described later. On the other hand, by setting the thickness of the collecting electrode 24 to be thicker than the thickness of the coating layer 20, it becomes possible to obtain necessary conductivity for the collecting electrode 24 even when the width of the collecting electrode 24 is narrowed, and consequently, an advantage can be obtained in that an effective area of light reception can be increased, or the like.

The formation method of the collecting electrode 24 is not particularly limited, but the collecting electrode 24 is preferably formed through electroplating. After the insulating coating layer 20 having the opening A is formed, a voltage is applied on the transparent conductive layer 14 and the collecting electrode 24 is formed through electroplating. After the primary conductive layer 24a is formed, the overcoat layer 24b is formed over the primary conductive layer 24a. Thicknesses of the primary conductive layer 24a and the overcoat layer 24b can be adjusted by conditions such as an applied voltage, a current value, a film formation duration, etc., during the electroplating.

The thicknesses of the coating layer 20 and the collecting electrode 24 can be checked by a cross-sectional observation using an electron microscope. For example, a relationship between the thicknesses of the coating layer 20 and the collecting electrode 24 can be identified using a cross sectional SEM or a cross sectional TEM.

The solar cell 100 is sealed by the encapsulating member 32. The sealing layer 28 is positioned over the coating layer 20 and the collecting electrode 24, and the encapsulating member 32 is pressed under a heated condition to seal the solar cell 100. The sealing layer 28 is preferably a resin such as ethylene vinyl acetate (EVA), polyvinyl butyrate (PVB). The encapsulating member on the side of the front surface (light receiving surface) of the solar cell 100 is preferably a glass plate or a resin sheet having a light transmitting characteristic. For the encapsulating member on the side of the back surface of the solar cell 100, in addition to the glass plate and resin sheet having light transmitting characteristic, a light blocking member such as a resin film formed by sandwiching a metal foil may be employed. Although not shown in the figures, the solar cell module 300 includes a plurality of solar cells 100 electrically connected by wiring members. The wiring member is generally connected to the bus bar portion of the collecting electrode.

In this manner, with the overcoat layer 24b covering the primary conductive layer 24a, diffusion of copper contained in the primary conductive layer 24a into the sealing layer 28 is inhibited, and color change and degradation of the sealing layer 28 can be prevented. Or, with the overcoat layer 24b, oxidation of copper contained in the primary conductive layer 24a is inhibited, and color change and degradation of the primary conductive layer 24a can be prevented. As a result of these measures, reliability of the solar cell module 300 can be improved.

In the above description, the coating layer 20, the collecting electrode 24, the sealing layer 28, and the encapsulating member 32 are described. The coating layer 22, the collecting electrode 26, the sealing layer 30, and the encapsulating member 34 on the opposite side may have similar structures. However, when the above-described structure is employed in at least a part of one of the sides, the advantage can be obtained to a certain degree.

Second Preferred Embodiment

Figure 5:
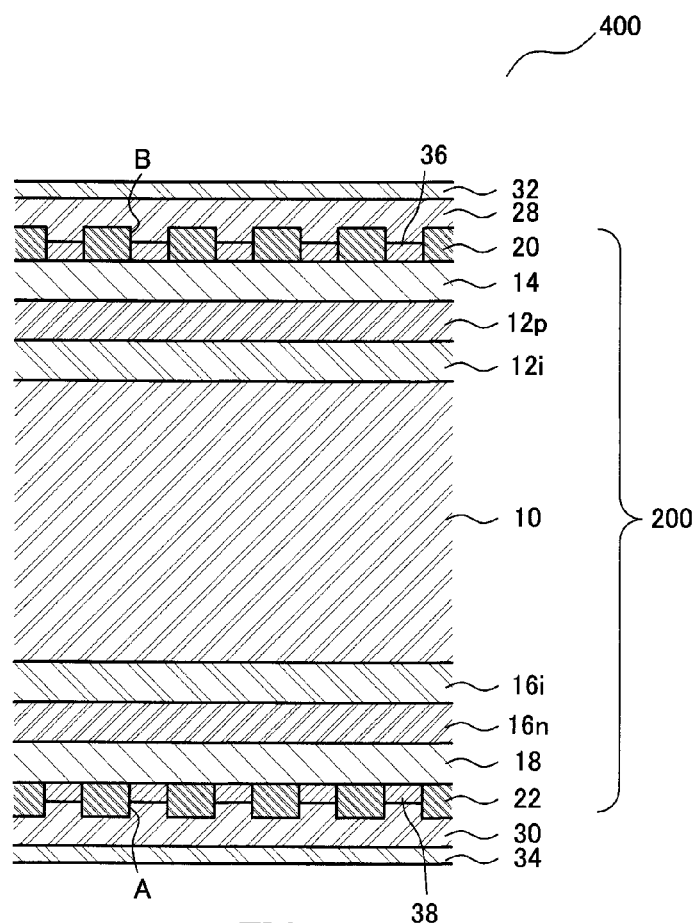
FIG. 5 is a cross sectional diagram showing a structure of a solar cell module according to a second preferred embodiment of the present invention.

As shown in a cross sectional diagram of FIG. 5, a solar cell 200 according to a second preferred embodiment of the present invention comprises the substrate 10, the i-type amorphous layer 12i, the p-type amorphous layer 12p, the transparent conductive layer 14, the i-type amorphous layer 16i, the n-type amorphous layer 16n, the transparent conductive layer 18, the coating layers 20 and 22, and collecting electrodes 36 and 38. A solar cell module 400 includes the solar cell 200, the sealing layers 28 and 30, and the encapsulating members 32 and 34.

The solar cell 200 has a similar structure to that of the solar cell 100 in the first preferred embodiment of the present invention except that the structures of the collecting electrodes 34 and 36 differ from those in the first preferred embodiment. Therefore, in the following, the collecting electrodes 34 and 36 will be described and other structures will not be described again.

Figure 6:
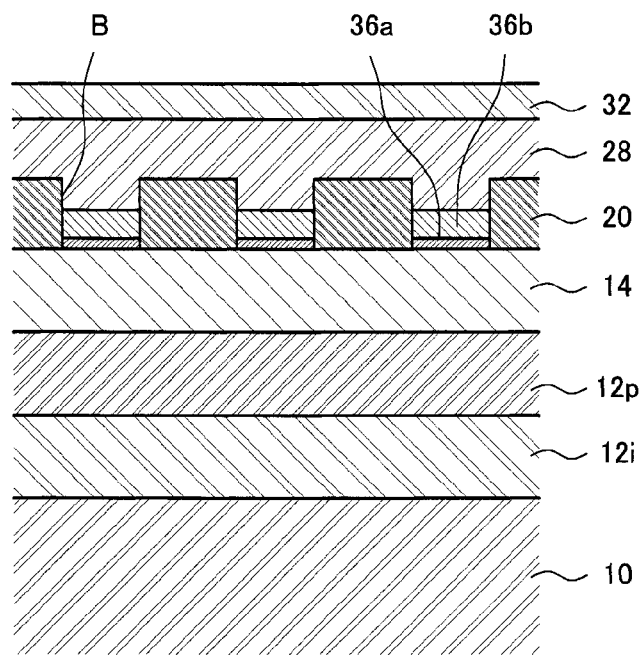
FIG. 6 is an enlarged cross sectional diagram showing a structure of the solar cell according to the second preferred embodiment of the present invention.
Figure 7:
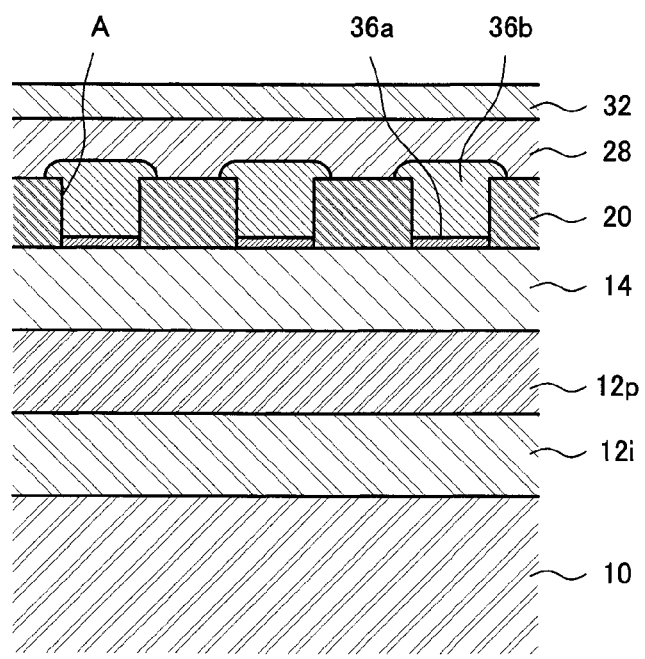
FIG. 7 is an enlarged cross sectional diagram showing another configuration of the structure of the solar cell module according to the second preferred embodiment of the present invention.

In the following, the collecting electrodes will be described exemplifying the collecting electrode 36. As shown in an enlarged cross sectional diagram of FIG. 6, the collecting electrode 36 has a multilayer structure of an undercoat layer 36a and a primary conductive layer 36b. The collecting electrode 36 is embedded in an opening B of the coating layer 20. The undercoat layer 36a is an undercoating layer of the primary conductive layer 36b, and is provided between the transparent conductive layer 14 and the primary conductive layer 36b so that the primary conductive layer 36b does not directly contact the transparent conductive layer 14. The primary conductive layer 36b is provided over the undercoat layer 36a. The undercoat layer 36a is a metal layer including at least one of nickel, tin, titanium, tantalum, tungsten, and palladium. The primary conductive layer 36b is a metal layer having a primary composition of copper (Cu). A thickness of the undercoat layer 36a may be preferably set in a range of greater than or equal to 0.2 µm and less than or equal to 10 µm, according to the materials forming the undercoat layer 36a. For example, because nickel has a smaller diffusion coefficient with respect to copper, when the undercoat layer 36a is formed with nickel, the thickness may be set to be greater than or equal to 0.2 µm, and when the undercoat layer 36a is formed with tin, the thickness is preferably set to be greater than or equal to 5 µm. A thickness of the primary conductive layer 36b is preferably set to be about a few tens of μm. A thickness of the collecting electrode 36 may be set to be thinner than the thickness of the coating layer 20 as shown in FIG. 6 or thicker than the thickness of the coating layer 20 as shown in FIG. 7.

The collecting electrode 36 is preferably formed through electroplating. After an insulating coating layer 20 having an opening B is formed, a voltage is applied to the transparent conductive layer 14, and the undercoat layer 36*a* is formed through electroplating. Then, the primary conductive layer 36*b* is formed over the undercoat layer 36*a*. The thicknesses of the undercoat layer 36*a* and the primary conductive layer 36*b* can be adjusted by conditions such as an applied voltage, a current value, and a film formation duration, etc., during the electroplating.

In this manner, by providing the undercoat layer 36*a* between the semiconductor which is a photoelectric conversion region and the primary conductive layer 36*b*, diffusion of copper contained in the primary conductive layer 36*b* to the semiconductor can be inhibited, and reduction in the power generation characteristic can be inhibited. As a result, reliability of the solar cell module 400 can be improved. In the above description, the collecting electrode 36 has been described. The collecting electrode 38 on the opposite side may be similarly formed. However, when the above-described structure is employed in at least a part of one of the sides, the advantage can be obtained to a certain degree.

Alternatively, the structure according to the first preferred embodiment of the present invention and the structure according to the second preferred embodiment of the present invention may be combined. In other words, the collecting electrode may be formed in a layered structure of the undercoat layer, primary conductive layer, and overcoat layer. In addition, the overcoat layer or the undercoat layer may have a layered structure of a plurality of materials.

Moreover, for the overcoat layer or the undercoat layer, an epoxy-based resin or the like may be employed. In this case, the overcoat layer or the undercoat layer may be formed by applying the resin through screen printing, inkjet printing, or the like. In addition, when a resin is used for the overcoat layer or the undercoat layer, an opening for electrically connecting the primary conductive layer and other conductive members may become necessary in the overcoat layer or the undercoat layer.

Moreover, the application of the present invention is not limited to a crystalline solar cell, and the present invention may be similarly applied to other types of thin film solar cells so long as the solar cell has the collecting electrode.

The invention claimed is:

1. A solar cell module comprising:
   a solar cell in which a collecting electrode is formed on at least one of a light receiving surface and a back surface; and
   a resin sealing layer positioned over the collecting electrode,
   wherein the solar cell comprises a transparent conductive layer
   the collecting electrode comprises:
      a primary conductive layer formed on the transparent conductive layer, the primary conductive layer comprising copper, and
      an overcoat layer covering an upper surface side of the primary conductive layer
   the collecting electrode is formed between insulating coating layers formed on the transparent conductive layer, and the collecting electrode is thinner than the coating layers on both sides of the collecting electrode, and
   the sealing layer covers a depression formed by an upper surface of the overcoat layer and side surfaces of the coating layers on both sides of the collecting electrode.

2. The solar cell module according to claim 1, wherein the overcoat layer is a metal layer comprising at least one of nickel, tin, titanium, tantalum, tungsten, and palladium.

3. The solar cell module according to claim 2, wherein the collecting electrode further comprises an undercoat layer covering a lower surface side of the primary conductive layer.

4. The solar cell module according to claim 1, wherein the overcoat layer is a resin layer.

5. The solar cell module according to claim 4, wherein the collecting electrode further comprises an undercoat layer covering a lower surface side of the primary conductive layer.

6. The solar cell module according to claim 1, wherein the collecting electrode further comprises an undercoat layer covering a lower surface side of the primary conductive layer.

* * * * *